United States Patent
Ueyama et al.

(10) Patent No.: US 12,327,579 B2
(45) Date of Patent: Jun. 10, 2025

(54) INSPECTION DEVICE

(71) Applicant: Samsung Electronics Co., Ltd., Suwon-si (KR)

(72) Inventors: Shinji Ueyama, Yokohama (JP); Ingi Kim, Suwon-si (KR); Harutaka Sekiya, Yokohama (JP); Tomoki Onishi, Yokohama (JP)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 429 days.

(21) Appl. No.: 18/047,820

(22) Filed: Oct. 19, 2022

(65) Prior Publication Data

US 2023/0125628 A1    Apr. 27, 2023

(30) Foreign Application Priority Data

Oct. 25, 2021   (JP) ................ 2021-173738
Aug. 9, 2022    (KR) ........ 10-2022-0099503

(51) Int. Cl.
    *G11C 11/16*    (2006.01)
    *G01R 33/12*    (2006.01)

(52) U.S. Cl.
    CPC ...... *G11C 11/1673* (2013.01); *G01R 33/1207* (2013.01)

(58) Field of Classification Search
    CPC ................ G11C 11/1673; G01R 33/1207
    See application file for complete search history.

(56) References Cited

U.S. PATENT DOCUMENTS

| 4,360,775 | A  |   | 11/1982 | Mauduit et al. |
|-----------|----|---|---------|----------------|
| 6,501,269 | B1 |   | 12/2002 | Vajda |
| 7,075,055 | B2 | * | 7/2006  | Nagai .............. G01R 33/032 356/369 |
| 7,126,699 | B1 |   | 10/2006 | Wihl et al. |
| 7,528,943 | B2 |   | 5/2009  | Brown et al. |

(Continued)

FOREIGN PATENT DOCUMENTS

| EP | 0020263 A1 | 12/1980 |
|----|------------|---------|
| EP | 1393091 A1 | 9/2002  |

(Continued)

OTHER PUBLICATIONS

Japanese Notice of Allowance dated Jan. 7, 2025 issued in Japanese Patent Application No. 2021-173738.

*Primary Examiner* — Walter L Lindsay, Jr.
*Assistant Examiner* — Milton Gonzalez
(74) *Attorney, Agent, or Firm* — Harness, Dickey & Pierce, P.L.C.

(57) ABSTRACT

To reduce a measurement time, an inspection device includes a stage configured to fix a magnetoresistive random access memory (MRAM) to a stage surface and moving the MRAM, a plurality of magnets configured to generate a gradient magnetic, a plurality of line sensors comprising a first line sensor for detecting a magneto-optical effect at a first location of the MRAM and a second line sensor for detecting the magneto-optical effect at a second location that is different from the first location by moving a location of the MRAM within the gradient magnetic field, and an information processor configured to process the magneto-optical effect detected by the plurality of line sensors. Thus, throughput may be improved.

12 Claims, 18 Drawing Sheets

(56) References Cited

U.S. PATENT DOCUMENTS

| | | |
|---|---|---|
| 9,891,177 B2 | 2/2018 | Vazhaeparambil et al. |
| 2008/0284422 A1 | 11/2008 | Ishio et al. |
| 2021/0025951 A1 | 1/2021 | Vajda |
| 2021/0118753 A1 | 4/2021 | Noh |

FOREIGN PATENT DOCUMENTS

| | | |
|---|---|---|
| JP | S56-026253 A | 3/1981 |
| JP | H05-333128 A | 12/1993 |
| JP | H 06-118061 A | 4/1994 |
| JP | H 06-317638 A | 11/1994 |
| JP | H 09-097821 A | 4/1997 |
| JP | 2004-529329 A | 9/2004 |
| JP | 2006-017557 A | 1/2006 |
| JP | 2016-020852 A | 2/2016 |
| JP | 2018-040610 A | 3/2018 |
| JP | 2021-081475 A | 5/2021 |
| JP | 2022-072599 A | 5/2022 |
| WO | WO-2002-068980 A1 | 9/2002 |
| WO | WO-2005-001495 A1 | 1/2005 |
| WO | WO-2006-003789 A1 | 1/2006 |

\* cited by examiner

INSPECTION DEVICE

CROSS-REFERENCE TO RELATED APPLICATIONS

This application claims the benefit of Japanese Patent Application No. 2021-173738, filed on Oct. 25, 2021, in the Japanese Patent Office and Korean Patent Application No. 10-2022-0099503, filed on Aug. 9, 2022, in the Korean Intellectual Property Office, the disclosures of which are incorporated herein M their entireties by reference.

BACKGROUND

Inventive concepts relate to inspection devices, and more particularly, to an inspection device for inspecting magnetic properties of a magnetoresistive random access Memory (MRAM) at a high speed and/or with high sensitivity.

A semiconductor memory device called an MRAM is or includes a nonvolatile memory having a magnetic tunnel junction (MU) as a component. In a semiconductor production line or semiconductor fabrication line, it may be important to inspect the abnormality of an MRAM formed on a wafer at an early stage, e.g. before completion of the MRAM, e.g. in order to improve the yield of the production of the MRAM. For inspection before the completion of the MRAM, it is necessary or desirable to obtain the magnetic field properties as well as to perform non-destructive external inspection by an optical microscope and/or an electron beam.

As a high-speed measuring unit of a magnetic field measurement, an optical measurement uses a magneto-optical effect called a magneto-optical Kerr effect (MOKE). According to this optical measurement using a magneto-optical effect, a magnetic hysteresis loop of a measurement point may be obtained due to a variation in polarization in reflected light while applying an external magnetic field to each magnetoresistive random access memory (MRAM) cell in an MRAM device and changing the strength of the external magnetic field. However, because it may take, for example, 10 to 30 seconds to obtain a magnetic hysteresis loop by applying an external magnetic field to each measurement point, it may take a long time to measure a semiconductor wafer including a large number of MRAMs. Example embodiments provide an inspection device capable of improving throughput by shortening a measurement time.

SUMMARY

According to some example embodiments, there is provided an inspection device that includes a stage configured to affix a magnetoresistive random access memory (MRAM) to a stage surface and to move the MRAM within an inspection surface parallel to the stage surface, a plurality of magnets configured to generate a gradient magnetic field in which a direction of a magnetic field component perpendicular to the inspection surface is changed from a first direction to a second direction opposite to or antiparallel to the first direction by a position of the inspection surface, a plurality of line sensors including a first line sensor configured to detect a magneto-optical effect at a first location of the MRAM and a second line sensor configured to detect the magneto-optical effect at a second location different from the first location, the first and second line sensors configured to detect the magneto-optical effect by moving a location of the MRAM within the gradient magnetic field, and an information processor configured to execute machine-readable instructions that, when executed by the information processor, cause the information processor to process the magneto-optical effect detected by the plurality of line sensors.

According to some example embodiments, there is provided an inspection device including a stage having a stage surface configured to have a wafer is fixed, and configured to move the wafer within an inspection surface parallel to the stage surface, the wafer including at least one of a plurality of MRAMs or a beta film of a perpendicular magnetization layer before formation of the MRAM, a plurality of magnets configured to generate a gradient magnetic field in which a direction of a magnetic field component perpendicular to the inspection surface is changed from a first direction to a second direction opposite to or antiparallel with the first direction by the position of the inspection surface, a plurality of line sensors including a first line sensor configured to detect a magneto-optical effect at a first location of the MRAM and a second line sensor configured to detect the magneto-optical effect at a second location different from the first location, the first and second line sensors configured to move a location of the MRAM within the gradient magnetic field, and an information processor configured to execute machine-readable instructions that, when executed by the information processor, cause the information processor to process the magneto-optical effect detected by the plurality of line sensors.

According to some example embodiments, there is provided an inspection device including a stage having a stage surface configured to have wafer affixed and configured to move the wafer within an inspection surface parallel to the stage surface, the stage including a plate member including a magnetic body, wherein the wafer includes at least one of a plurality of MRAMs or a beta film of a perpendicular magnetization layer before formation of t MRAM and the plate member is buried in the stage, a plurality of magnets configured to generate a gradient magnetic field in which a direction of a magnetic field component perpendicular to the inspection surface is changed from a first direction to a second direction opposite to or antiparallel with the first direction by the position of the inspection surface, a plurality of line sensors including a first line sensor configured to detect a magneto-optical effect at a first location of the MRAM and a second line sensor configured to detect the magneto-optical effect at a second location different from the first location, the first and second line sensors configured to move a location of the MRAM within the gradient magnetic field, and an information processor configured to execute machine-readable instructions that, when executed by the information processor, cause the information processor to process the magneto-optical effect detected by the plurality of line sensors.

The plurality of line sensors detect at least one of the magneto-optical effect by the magnetic field component in the first direction, by the magnetic field component in the second direction, and by a magnetic field component in a direction perpendicular to the inspection surface. The information processor inspects the MRAM through a difference between the magneto-optical effect detected by the first line sensor and the magneto-optical effect detected by the second line sensor. When viewed in a direction perpendicular to the stage surface, a region surrounded by an outer edge of the plate member includes the MRAM and/or the beta film that is affixed to the stage surface.

BRIEF DESCRIPTION OF THE DRAWINGS

Various example embodiments of inventive concepts will be more clearly understood from the following detailed description taken in conjunction with the accompanying drawings in which.

DETAILED DESCRIPTION OF VARIOUS EXAMPLE EMBODIMENTS

Figure 1:
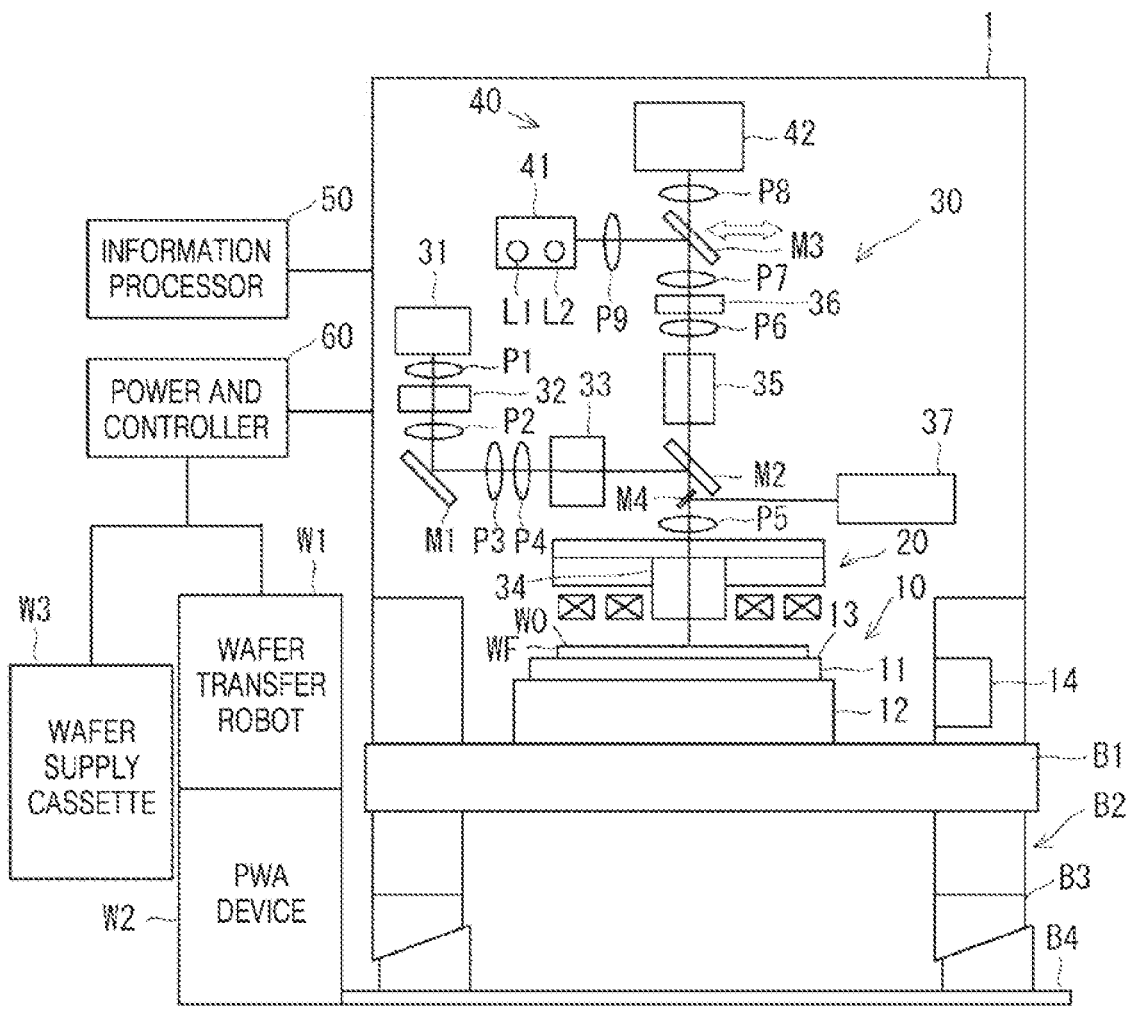
FIG. 1 is a diagram of an inspection device according to various example embodiments.
Figure 2:
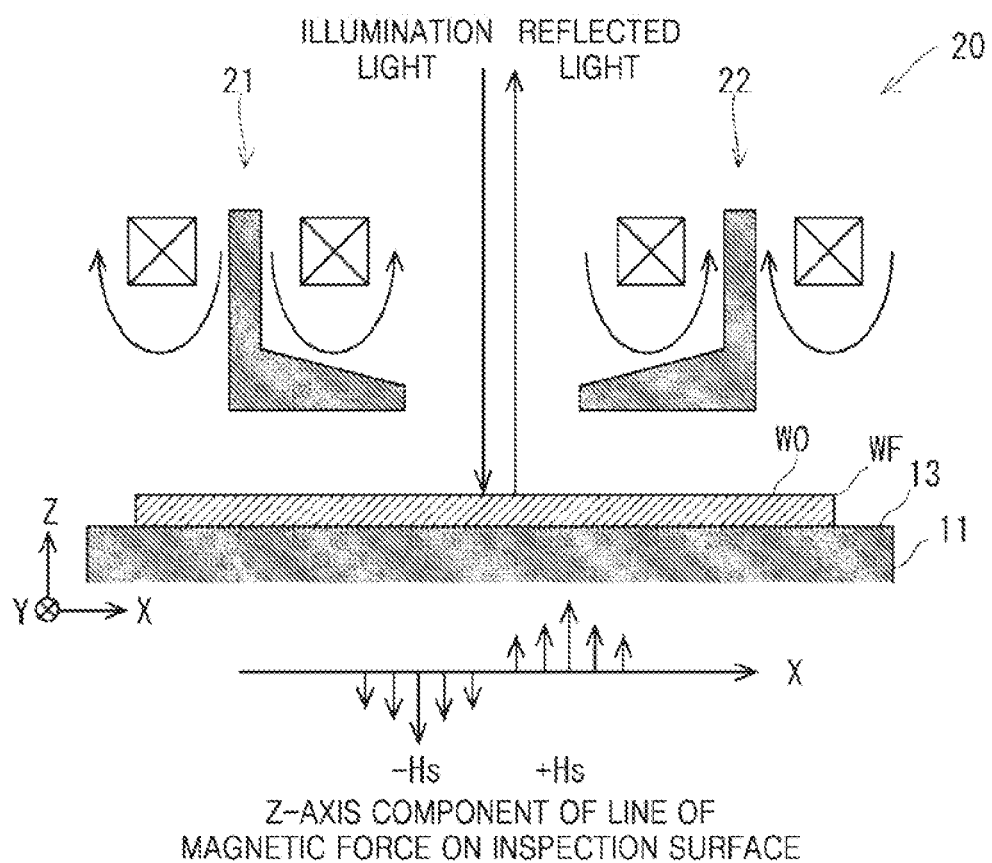
FIG. 2 illustrates magnets of the inspection device according to various example embodiments.

An inspection device according) various example embodiments will now be described. FIG. 1 FIG. 2 illustrates an inspection device 1 according to various example embodiments. As shown in FIG. 1, the inspection device 1 includes devices W1 through W3 configured to transfer of a wafer WF, members B1 through B4 serving as supports of the inspection device 1, a stage 10, a plurality of magnets 20, an optical system 30, a detector 40, an information processor 50, and a power and controller 60. For example, an object to be inspected is the wafer WF including magnetoresistive random access memory (MRAM). For example, the wafer WF may include a plurality of dies that each include a plurality of MRAM cells. The wafer WF may be a 100 mm diameter wafer, a 150 mm diameter wafer, a 200 mm diameter wafer, a 300 mm diameter water, or a 450 mm diameter wafer; however, example embodiments are not limited thereto. The wafer WF may have an edge containing a notch portion, and/or a flat portion; example embodiments are not limited thereto.

The devices W1 through W3 related to transfer of the wafer WF include water transfer robot W1, a prior wafer alignment (PWA) device W2, and a wafer supply cassette W3. The wafer transfer robot W1 transfers the wafer WF to be inspected from the wafer supply cassette W3 into the inspection device 1. The PWA device W2 corrects a rotation angle and/or a shift of the wafer WF. The wafer WF is corrected by the PWA device W2 and then transferred to the stage 10 of the inspection device 1.

The members B1 through 134 serving as supports of the inspection device 1 include a stone base B1, an active vibration isolator 132, a wedge B3, and a distribution plate B4. The stone base B1 serves as a base on which members such as the stage 10 and the optical system 30 are arranged. The active vibration isolator 132 suppresses or reduces the vibration of a member on the stone base B1 The wedge 133 performs horizontal adjustment of the stone base B1 and the active vibration isolator 132. The distribution plate B4 distributes a device load on the floor. The information processor 50 processes information detected by the detector 40. The power and controller 60 supplies power to the inspection device 1 and at the same time controls each or at least some component of the inspection device 1.

The stage 10 includes a moving part 11 and a body part 12. The upper surface of the moving part 11 is referred to as a stage surface 13. Thus, the stage 10 has the stage surface 13. The moving part 11 of the stage 10 may include a wafer check for holding the wafer WF. The wafer WF is fixed or affixed to the stage surface 13 due to one or more of vacuum or static electricity caused by the wafer check. The stage 10 may be or may include an electrostatic chuck; however, example embodiments are not limited thereto The body part 12 has a translational and/or rotational axis of XYZθ having an actuator by one or more of a linear motor, a ball screw, a VCM, a piezo, or the like in order to move the moving part 11 holding the wafer WF.

The moving part 11 moves relative to the body part 12, based on the translational and/or rotational axis of XYZθ. An inspection surface W0 is introduced as a surface parallel to the stage surface 13. The wafer WF (e.g. the MRAM) fixed to the stage surface 13 moves within the inspection surface W0. Respective locations of the wafer WF and the MRAM may be measured by a laser interferometer 14. In this way, the stage 10 fixes the MRAM to the stage surface 13 and moves the MRAM within the inspection surface W0 parallel to the stage surface 13. For example, the stage 10 moves the MRAM in a straight line in one direction within the inspection surface W0. As shown in FIG. 1, in some example embodiments, the configuration of an XYZθ translational and/or rotational stage is shown. Alternatively or additionally, in some example embodiments, the configuration of an rθ radius and/or rotational stage is also shown. Herein, r may refer to a distance from the center of the wafer WF as described below.

FIG. 2 illustrates the magnets 20 of the inspection device 1 according to various example embodiments. As shown in FIG. 2, for convenience of explanation, an XYZ orthogonal coordinate axis system is introduced. A direction orthogonal to or normal or perpendicular to the inspection surface W0 is set to be a Z-axis direction, and two directions orthogonal to each other in a plane parallel to the inspection surface W0 is set to be an X-axis direction and a Y-axis direction. As shown in FIG. 2, the plurality of magnets 20 of the inspection device 1 include, for example, a plurality of electromagnets 21 and a plurality of electromagnets 22. The plurality of magnets 20 may include two electromagnets 21 and 22 of which currents applied to the two electromagnets 21 and 22 are simultaneously controlled, and/or may include two electromagnets 21 and 22 of which the applied currents are independently controlled. Alternately or additionally, the plurality of magnets 20 may include a permanent magnet.

Figure 3:
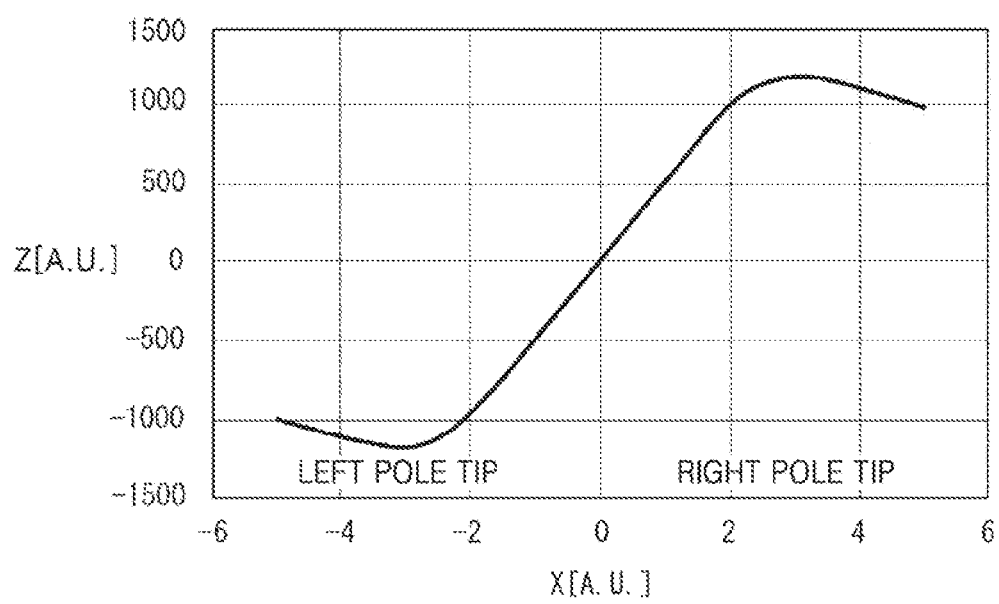
FIG. 3 is a graph showing a magnetic field component in a Z-axis direction of a line of magnetic force on an inspection surface, in the inspection device according to various example embodiments, wherein a horizontal axis indicates a location on the inspection surface in an X-axis direction and a vertical axis indicates the magnetic field component in the Z-axis direction of the line of magnetic force on the inspection surface.

FIG. 3 is a graph showing a magnetic field component in the Z-axis direction of a line of magnetic farce on the inspection surface W0, in the inspection device 1 according to various example embodiments. The horizontal axis indicates a location in the X-axis direction on the inspection surface W0, and the vertical axis indicates the magnetic field component in the Z-axis direction of a line of magnetic force on the inspection surface W0.

As shown in FIGS. 2 and 3, the plurality of magnets 20 generate a gradient magnetic force on the inspection surface W0. In the gradient magnetic farce, a direction of the magnetic field component in the Z-axis direction perpendicular to the inspection surface W0 is changed from a +Z-axis direction to a −Z-axis direction (e.g. to antiparallel direction) due to a location of the inspection surface W0. The −Z-axis direction is the opposite direction or the anti-parallel direction to the +Z-axis direction. As such, the plurality of magnets 20 generate a magnetic field that is temporally constant and different according to locations.

As shown in FIG. 1, the optical system 30 may include an optical microscope. The optical microscope focuses an image on the surface of the wafer WF. The optical system 30 includes a light source 31, a filter 32, a polarizer 33, an objective lens 34, an analyzer 35, a filter 36, an argon-fluoride (AF) sensor 37 and a plurality of lenses P1 through P9 for obtaining the focus of the wafer WF, and a plurality of mirrors M1 through M4.

The light source 31 emits illumination light. The illumination light may be or may include, for example, laser light, for example krypton-fluoride and/or argon-fluoride laser light. The illumination light emitted from the light source 31 includes a dynamically determined (or, alternatively, predetermined) wavelength band by passing through the filter 32. The illumination light transmitted by the filter 32 is converted to include linearly polarized light by the polarizer 33. The illumination light including linearly polarized light is reflected by the mirror M2 and condensed on the wafer WF by the objective lens 34. The mirror M2 is or includes, for example, an unpolarized beam splitter.

The objective lens 34 is for imaging a pattern on the wafer WF, and, in general, a non-magnetic wafer WF may be selected. When the wafer WF includes MRAM, a polarization angle of the linearly polarized light is changed by magneto-optic Kerr effect. Reflected light from the wafer WF passes through the objective lens 34 and is incident on the analyzer 35. The analyzer 35 detects a change in the polarization angle of the linearly polarized light included in the reflected light. The analyzer 35 may include, for example, a light analyzer. The reflected light passing through the analyzer 35 is incident on the detector 40 through the filter 36. The AF sensor 37 is or includes a component for focusing the surface of the wafer WF. The AF sensor 37 uses a semiconductor laser light source that is longer or shorter than the wavelengths of the illumination light and the reflected light used in the optical system 30.

The detector 40 obtains the pattern of the wafer WF The detector 40 may include a plurality of line sensors L1 and L2 and a review monitor 42. The plurality of line sensors L1 and L2 are collectively referred to as a line sensor 41. The number of line sensors 41 is not limited to two, and may be three or more. The plurality of line sensors 41 may be or may include a Time Delay Integration (TDI) sensor. The review monitor 42 may be or may include a charge-coupled device (CCD) sensor. The CCD sensor may be used for review. By inserting the mirror M3, the optical paths of the line sensors L1 and L2 and the review monitor 42 are changed.

Figure 4:
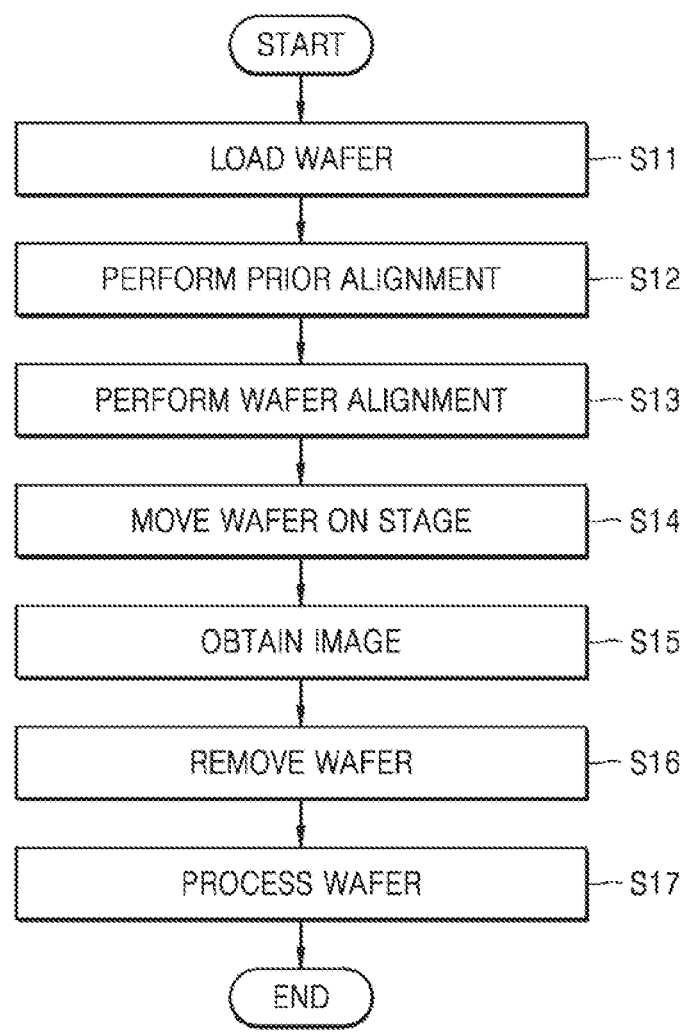
FIG. 4 is a flowchart of a method of transferring a wafer that is to be inspected, inspection device according to various example embodiments.

FIG. 4 is a flowchart of a method of transferring, the wafer WF to be inspected, in the inspection device 1 according to various example embodiments. As shown in operation S11 of FIG. 4, first, the wafer WF is loaded in the inspection device 1. In detail, the wafer transfer robot W1 transfers the wafer WF to be inspected from the wafer supply cassette W3 into the inspection device 1.

As shown in operation S12, the PWA device W2 corrects the rotation angle or the shift of the wafer WF The wafer WF is corrected by the PWA device W2 and then transferred to the stage 10 of the inspection device 1. As shown in operation S13, the wafer WF is positioned on the stage 10. For example, the position of the wafer WF is aligned with the stage 10 using the laser interferometer 14. As shown in operation S14, the wafer WF on the stage 10 is moved to inspect the MRAM. As such, the MRAM is moved in the gradient magnetic field.

As shown in operation S15, an image of a magneto-optical effect in the MRAM of the wafer WF is obtained by the detector 40. In detail, the MRAM is inspected by measuring a polarization angle due to the magneto-optical effect of the MRAM. As shown in operation S16, the wafer WF is removed from the inspection device 10 after being inspected. As shown in operation S17, the wafer WF may further be processed based on the image, so as to fabricate a semiconductor device.

Figure 5:
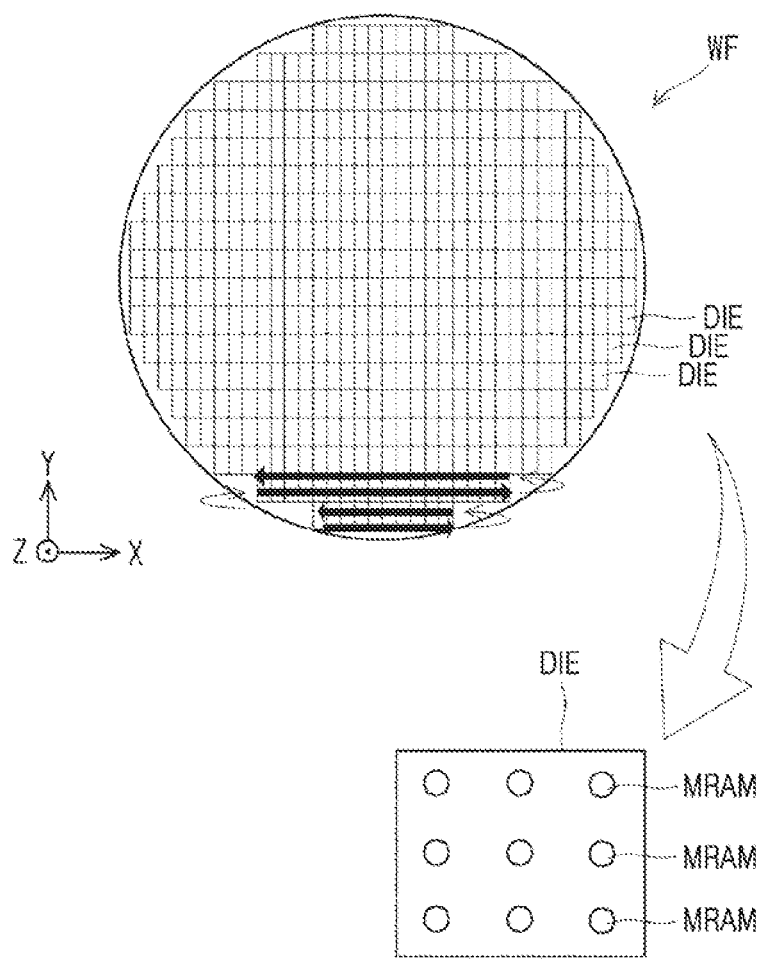
FIG. 5 is a plan view of the wafer according to various example embodiments.

FIG. 5 is a plan view of the wafer WF according to various example embodiments. As shown in FIG. 5, the wafer WF includes a plurality of chips or a plurality of dies DIE. The plurality of dies DIE may be incomplete; for example, only a beta film of as perpendicular magnetization layer before the dies DIE are formed may be an object to be inspected. FIG. 5 omits some reference characters for simplification purposes only. According to some example embodiments, each die DIE may be a rectangle having short sides and long sides in the X-axis direction and the Y-axis direction. The plurality of dies DIE may be arranged to have a repeating periodicity spatially in the X-axis direction and the Y-axis direction on the wafer WF. The die DIE may include a plurality MRAMs. Each MRAM has memory regions with a repeating periodicity arranged in an array form. The line sensor 41 obtains an image in a forward direction while moving in the X-axis direction so as to traverse the plurality of dies DIE. When an image in one row in the X-axis direction is finally obtained, the image moves in the Y-axis direction, and the image in one row in the X-axis direction is again obtained in a reverse direction. The line sensor 41 may raster along the wafer WF.

Figure 6:
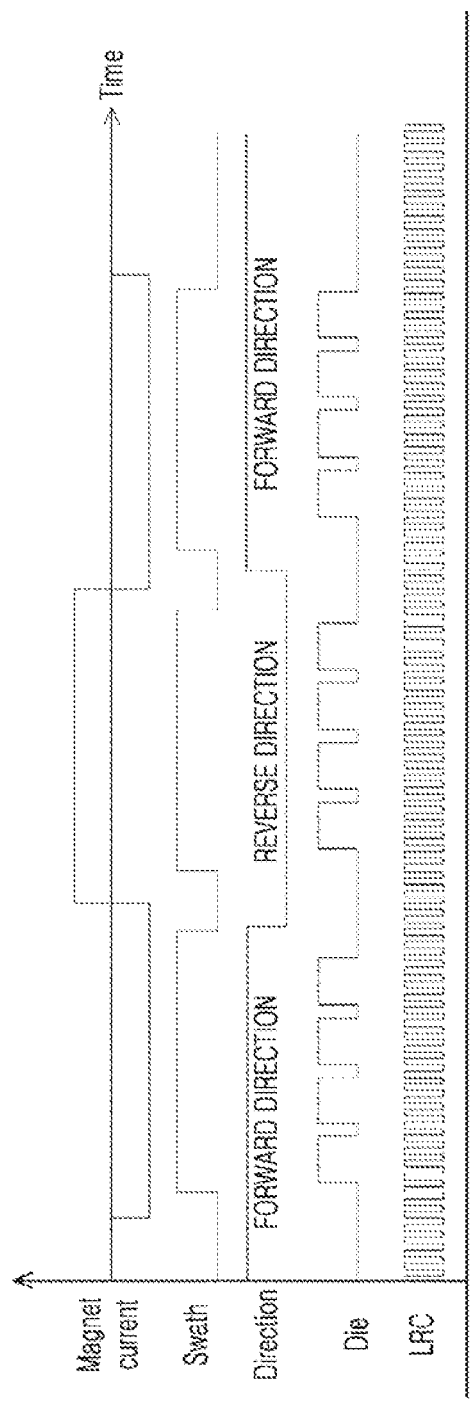
FIG. 6 is a sequence diagram illustrating an inspection method of a die included in the wafer according to various example embodiments, wherein a horizontal axis represents time and a vertical axis represents a current of a magnet, an inspection table, a movement direction of the wafer, a die inspection period, and a signal LRC for synchronizing a moving stage with a camera.

FIG. 6 is a sequence diagram illustrating an inspection method of as die DIE included in the wafer WF according to various example embodiments, wherein the horizontal axis represents time, and the vertical axis represents the current of a magnet, an inspection table, a movement direction of the wafer WF, a die inspection period, and a signal LRC. As shown in FIG. 6, when all the dies IMF of the wafer WF are inspected, the moving direction of the line sensor 41 alternately repeats between a for ward direction and a reverse direction and rasterizes hack and forth. An image may be obtained without gaps by including several pixels for filter processing or scan correction. According to the circumstances of the inspection time, a thorough inspection does not need to be performed, and a sparse inspection may be performed in the Y direction.

As shown in FIG. 1, a laser beam linearly polarized by the polarizer 33 is radiated the wafer WF, and light reflected by the wafer WF is made incident on the detector 40 through the analyzer 35 including a light analyzer.

Because the amount of light incident on the detector 40 by the analyzer 35 changes according to the polarization angle, a magnetization distribution is imaged. By changing the magnetic field applied to the MRAM, the magnetic properties of the MRAM in the wafer WF may be measured from the distribution of polarization angles according to the magnetic field.

Figure 7:
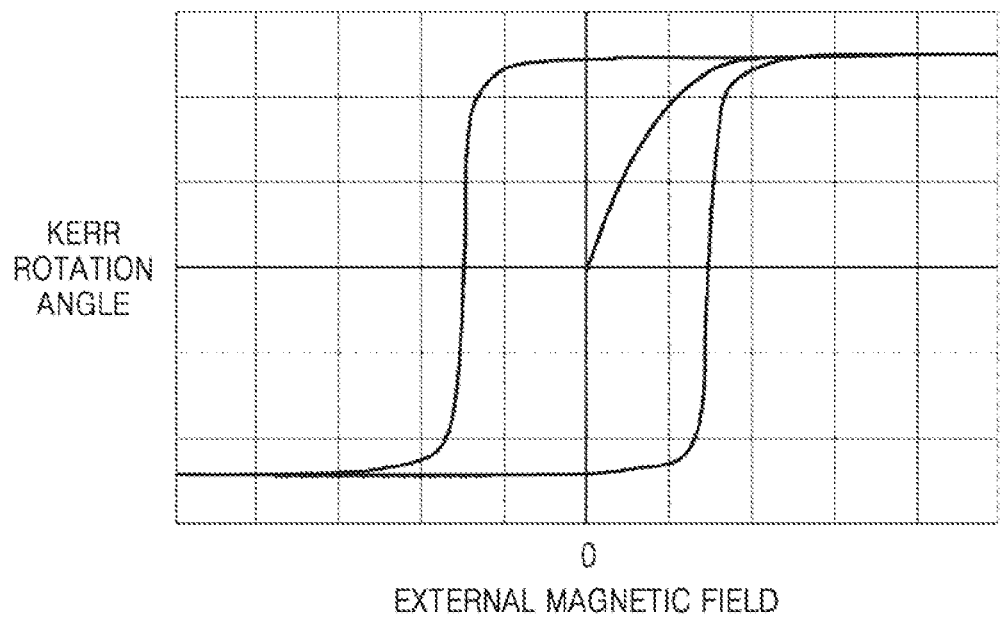
FIG. 7 is a diagram illustrating magnetic properties of magnetoresistive random access memory (MRAM), wherein a horizontal axis represents an external magnetic field and a vertical axis represents a Kerr rotation angle.

FIG. 7 is a diagram illustrating the magnetic properties of the MRAM, wherein the horizontal axis represents an external magnetic field and the vertical axis represents a Kerr rotation angle. As shown in FIG. 7, when the external magnetic field is increased from a case where the external magnetic field is 0, the Kerr rotation angle increases. However, when the Kerr rotation angle reaches a particular or certain value, the Kerr rotation angle is saturated, and does not change even when the external magnetic field is increased. Next, when the external magnetic field is decreased from a saturated state, the Kerr rotation angle decreases. Even when the external magnetic field is set to be 0, the Kerr rotation angle remains and there may be remnant rotation. When the external magnetic field is further reduced, the Kerr rotation angle reaches a certain value and becomes saturated. Therefore, even when the external magnetic field is decreased, the external magnetic field does not change. When the external magnetic field is increased from a saturated state, the Kerr rotation angle increases. When the external magnetic field is made large and the external magnetic field is made small, a difference occurs in the path of the value of the Kerr rotation angle. When the external magnetic field is made large and the external magnetic field is made small as described above, a hysteresis curve to another route is formed.

Figure 8:
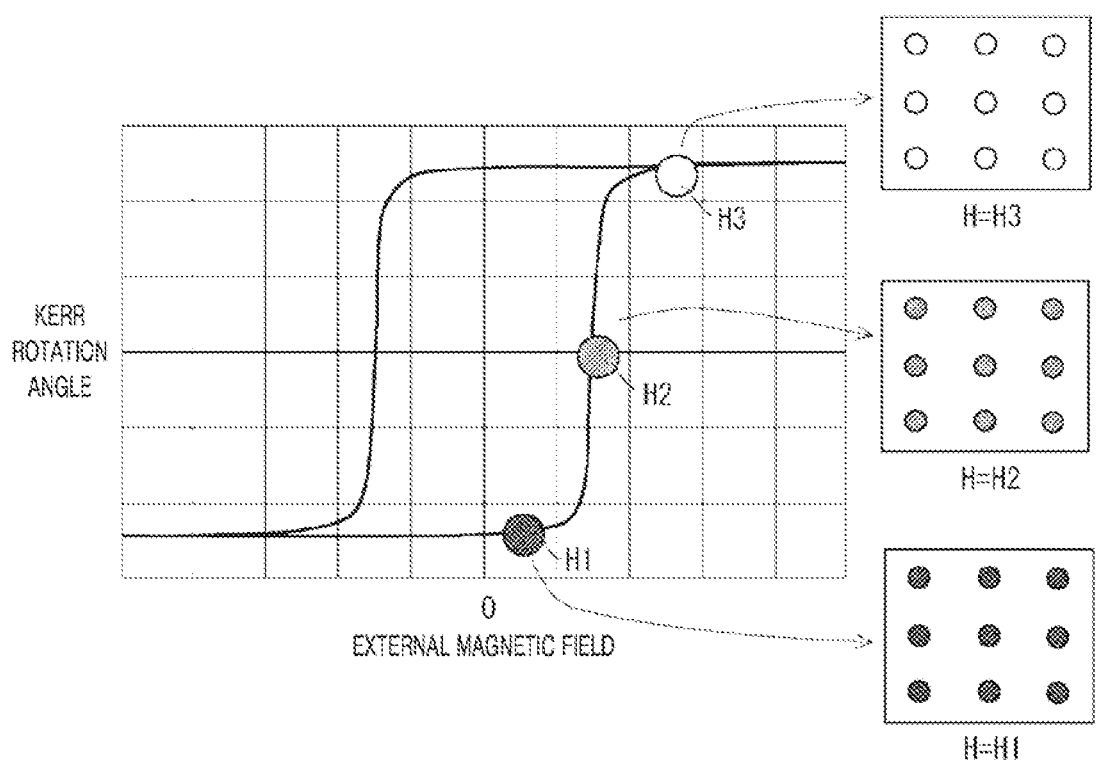
FIG. 8 is a diagram illustrating magnetic properties of a MRAM, wherein a horizontal axis represents an external magnetic field and a vertical axis represents a Kerr rotation angle.

FIG. 8 is a diagram illustrating the magnetic properties of the MRAM, wherein the horizontal axis represents an external magnetic field and the vertical axis represents a Kerr rotation angle. FIG. 8 also schematically shows an image including the polarization state of the MRAM when an external magnetic field H is H1, H2, and H3. As shown in FIG. 8, an image captured when the external magnetic field is gradually increased shows luminance due to different Kerr rotation angles when the external magnetic field H is H1, H2, and H3. The Kerr rotation angle and the luminance detected by the detector 40 are correlated with each other. Accordingly, the coercive force of each MRAM (magnetic field of the image of H2 in the above example) and a gap therebetween may be obtained from the image obtained by the detector 40. When the size of the MRAM is smaller than a camera resolution and/or smaller than an optical resolution, average magnetic properties of an observation area may be obtained.

According to various example embodiments, the MRAM is inspected while being moved in the gradient magnetic field. On the contrary, a method of changing the magnetic field by fixing the stage 10 and changing a current flowing through an electromagnet needs or desires time to change the current. For high-sensitivity detection, it is necessary or desirable to increase an exposure time of the camera. In particular, when the entire surface of the wafer WF is inspected, there is a need or desire to repeat a measurement of changing the current flowing through the electromagnet after moving each MRAM in the wafer WF to an inspection position. This may increase the inspection time, which may be a problem.

Various example embodiments may reduce the time for changing the current flowing through the electromagnet. By synchronizing the detector 40 with the movement of the MRAM, the exposure time of the camera may be shortened.

An inspection method for moving an MRAM in a gradient magnetic field may use a single line sensor or may use a plurality of line sensors. Before explaining a case of using a plurality of line sensors according to various example embodiments, a case of using one line sensor in a comparative example will now be described.

Figure 9:
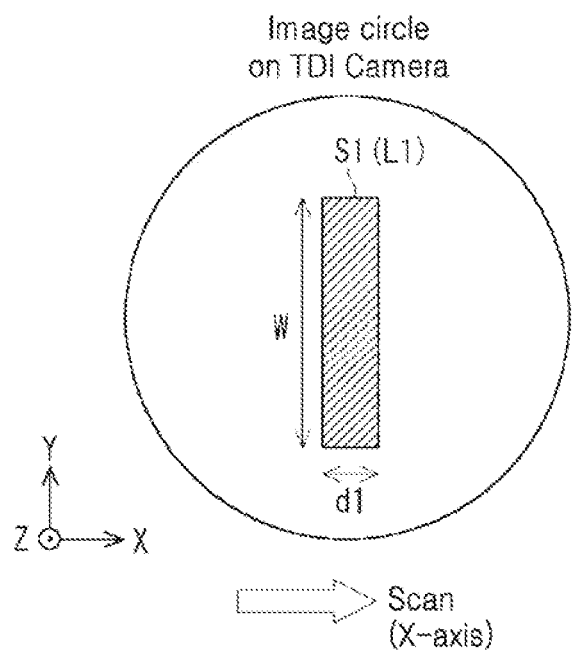
FIG. 9 is an image view illustrating a region on an inspection surface that is detected by one line sensor, in an inspection device according to a comparative example.

FIG. 9 is an image view illustrating a region S1 on the inspection surface W0 that is detected by one line sensor L1 in an inspection device according to a comparative example. As shown in FIG. 9, the line sensor L1 detects the region S1 extending in the Y-axis direction in the field of view of the review monitor 42. By moving the MRAM in the X-axis direction, the magneto-optical effect of the MRAM, for example, a change in luminance due to the Kerr rotation angle, is detected.

Figure 10:
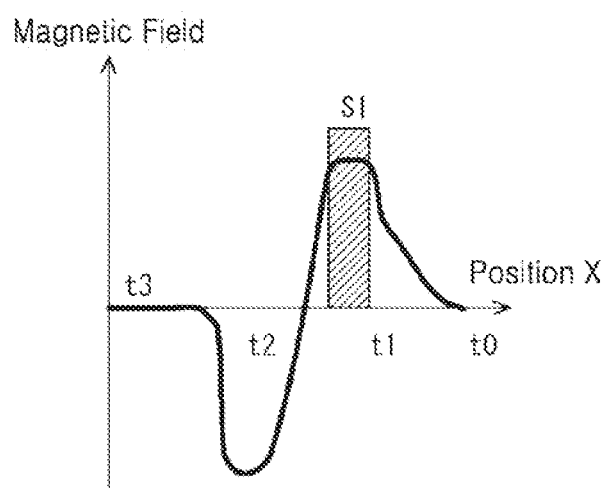
FIG. 10 is a graph showing a magnetic field component in a Z-axis direction on the inspection surface, in the inspection device according to a comparative example, wherein a horizontal axis indicates a location in an X-axis direction on the inspection surface and a vertical axis indicates the magnetic field component in the Z-axis direction on the inspection surface.
Figure 11:
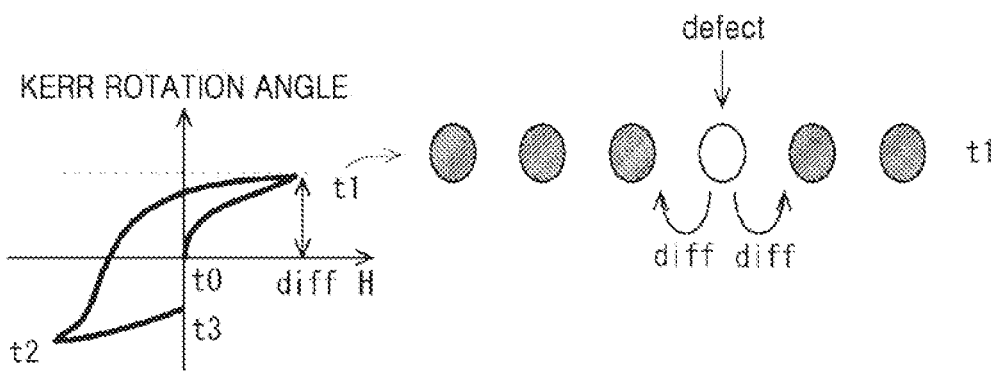
FIG. 11 is a graph showing a Kerr rotation angle on the inspection surface, in the inspection device according to a comparative example, wherein a horizontal axis represents a magnetic field component in the Z-axis direction of an external magnetic field, and a vertical axis represents the Kerr rotation angle.

FIG. 10 is a graph showing a magnetic field component in the Z-axis direction on the inspection surface W0 in the inspection device according to a comparative example. In FIG. 10, the horizontal axis indicates a location in the X-axis direction on the inspection surface W0, and the vertical axis indicates the magnetic field component in the Z-axis direction on the inspection surface W0. FIG. 10 also illustrates the region S1 on the inspection surface W0 that is detected by the sensor L1. FIG. 11 is a graph showing a Kerr rotation angle on an inspection surface in the inspection device according to a comparative example. In FIG. 11, the horizontal axis represents the magnetic field component in the Z-axis direction of the external magnetic field, and the vertical axis represents the Kerr rotation angle. FIG. 11 also schematically shows the luminance of a plurality of MRAMs.

As shown in FIGS. 10 and 11, at time t=t0. MRAM is positioned at a region where the magnetic field component in the Z-axis direction is zero. When the MRAM is moved in the X-axis direction, the external magnetic field received by the MRAM increases. Accordingly, the Kerr rotation angle is also increased.

However, when the Kerr rotation angle reaches a certain value, the Kerr rotation angle is saturated, and does not change even when the external magnetic field is increased (time t=t1). In the comparative example, the line sensor L1 obtains the luminance of the plurality of MRAMs arranged in the Y-axis direction at time t=t1 due to the Kerr rotation angle. For example, when there is a defect in the plurality of MRAMs arranged in the Y-axis direction, a defective MRAM exhibits a different luminance from normal MRAMs near the defective MRAMs case, the line sensor L1 detects a difference (diff) between the luminance of the defective MRAM and the luminance of a nearby normal MRAM.

Figure 12:
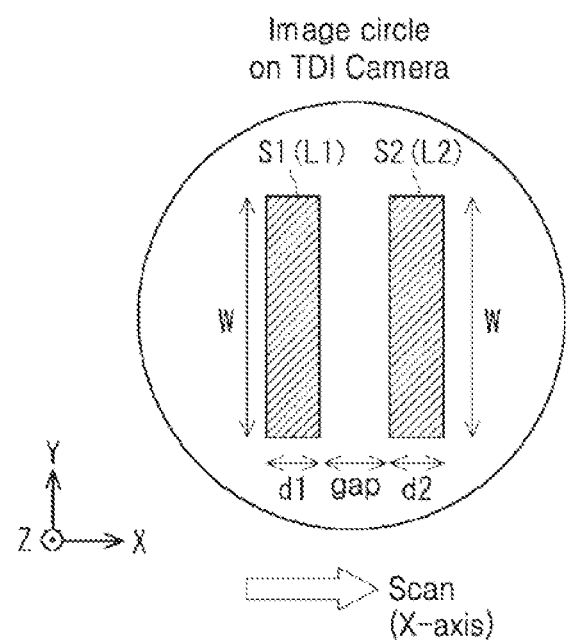
FIG. 12 is an image view illustrating a region on the inspection surface that is by a plurality of line sensors, in the inspection device according to various example embodiments.
Figure 13:
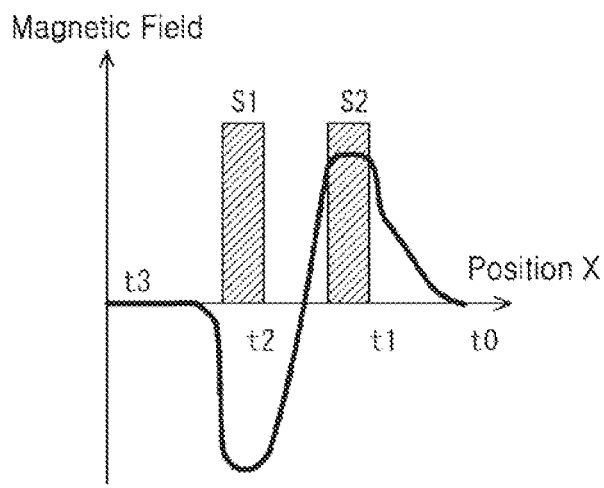
FIG. 13 is a graph showing a magnetic field component in the Z-axis direction on the inspection surface, in the inspection device according to various example embodiments, wherein the horizontal axis indicates a location on the inspection surface in the X-axis direction and the vertical axis indicates the magnetic field component in the Z-axis direction on the inspection surface.
Figure 14:
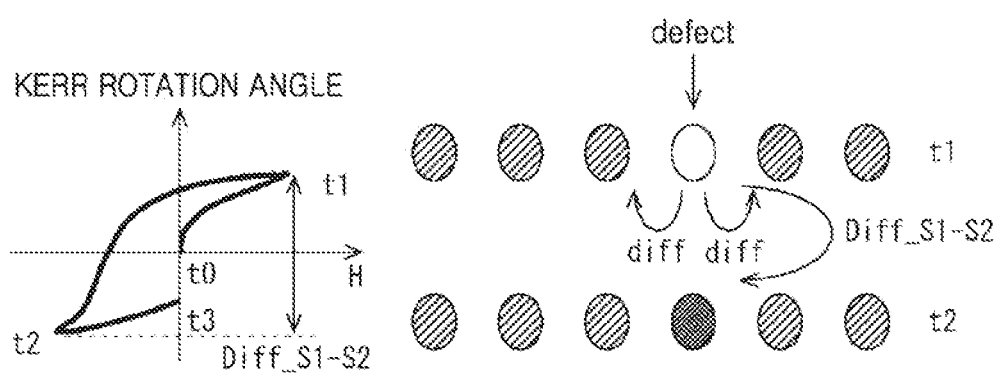
FIG. 14 is a graph showing a Kerr rotation angle on the inspection surface, in the inspection device according to various example embodiments, wherein a horizontal axis represents a magnetic field component in the Z-axis direction a an external magnetic field, and a vertical axis represents the Kerr rotation angle.

An inspection method of the MRAM according to various example embodiments will now be described. Example embodiments may have the plurality of line sensors L1 and L2. FIG. 12 is an image view illustrating a region S1 and a region. S2 on the inspection surface W0 that are detected by the plurality of line sensors L1 and L2, in the inspection device 1 according to various example embodiments. As shown in FIG. 12, the plurality of line sensors L1 and L2 detect the region S1 and the region 52 each extending in the Y-axis direction, respectively. The region S1 and the region S2 have lengths d1 and d2 in the X-axis direction, and lengths W in the Y-axis direction. The region S1 and the region S2 are arranged with a gap therebetween in the X-axis direction, FIG. 13 is a graph showing a magnetic field component in the Z-axis direction on the inspection surface W0, in the inspection device 1 according to various example embodiments, wherein the horizontal axis indicates a location on the inspection surface W0 in the X-axis direction and the vertical axis indicates the magnetic field component in the Z-axis direction on the inspection surface W0. FIG. 13 illustrates the region S1 and the region S2 on the inspection surface W0 that are detected by line sensors, respectively. FIG. 14 is a graph showing a Kerr rotation angle on the inspection surface W0, in the inspection device 1 according to various example embodiments, wherein the horizontal axis indicates a magnetic field component of an external magnetic field in the Z-axis direction and the vertical axis indicates the Kerr rotation angle. FIG. 14 also schematically shows the luminance of a plurality of MRAMs.

As shown in FIGS. 13 and 14, at time t=t0, an MRAM is positioned at a region where the magnetic field component in the Z-axis direction is zero. When the MRAM is moved in the X-axis direction, an external magnetic field received by the MRAM increases. Accordingly, the Kerr rotation angle is also increased. However, when the Kerr rotation angle reaches a certain value, the Kerr rotation angle is saturated, and does not change even when the external magnetic field is increased (time t=t1). The line sensor L2 obtains the luminance of the plurality of MRAMs arranged in the Y-axis direction at time t=t1 due to the Kerr rotation angle.

When the MRAM is moved in the X-axis direction, an external magnetic field received by the MRAM decreases. Accordingly, the Kerr rotation angle is also decreased. The external magnetic field becomes 0. When the MRAM is moved in the X-axis direction, an external magnetic field received by the MRAM reverses. Accordingly, the Kerr rotation angle is decreased. When the MRAM is moved in the X-axis direction, an external magnetic field in a reverse direction received by the MRAM increases. Accordingly, the Kerr rotation angle is further decreased.

At time t=t2, when the external magnetic field in the reverse direction increases, the Kerr rotation nude decreases and the luminance thereof also decrease. The line sensor L1 obtains the luminance of the plurality of MRAMs arranged in the Y-axis direction at time t=t2 due to the Kerr rotation angle. When the MRAM is moved in the X-axis direction, an external magnetic field in a reverse direction received by the MRAM decreases. The external magnetic field becomes 0.

As shown in FIG. 14, according to various example embodiments, the line sensor L2 obtains the luminance of the plurality of MRAMs at time t=t1. The line sensor L1 obtains the luminance of the plurality of MRAMs at time t=t2. As such, according to various example embodiments, the line sensor L2 detects a magneto-optical effect of the MRAM at the position of the time t=t1 by moving the location of the MRAM in the gradient magnetic field. The line sensor L1 detects a magneto-optical effect of the MRAM at the position of the time t=t2. Accordingly, the plurality of line sensors L1 and L2 detect a magneto-optical effect due to a magnetic field component in the +Z-axis direction and a magneto-optical effect due to a magnetic field component in the −Z-axis direction, respectively.

At time t=t1, when there is a defect in the plurality of MRAMs arranged in the Y-axis direction, the line sensor L2 detects the luminance of the defect. A defective MRAM exhibits a different luminance from a nearby normal MRAM. At time t=t2, when there is a defect in the plurality of MRAM s arranged in the Y-axis direction, the line sensor L1 detects the luminance of the defect. A defective MRAM exhibits a different luminance from a nearby normal MRAM.

The information processor 50 processes the magneto-optical effects detected by the plurality of line sensors L1 and L2. In detail, the information processor 50 inspects the MRAM from a difference between the magneto-optical effect detected by the line sensor L1 and the magneto-optical effect detected by the line sensor L2. For example, the information processor 50 detects a difference (Diff) between a luminance of the defective MRAM at time t=t1 detected by the line sensor L2 and a luminance of the defective MRAM at time t=t2 detected by the line sensor L1. As such, the information processor 50 compares the luminances of the same MRAM at different times t1 and t2 with each other.

The information processor 50 may detect a difference (Diff) between the luminance of the detective MRAM detected by the line sensor L1 and the luminance of a nearby normal MRAM and may detect a difference (Diff) between the luminance of the defective MRAM detected by the line sensor L2 and the luminance of the nearby normal MRAM. The information processor 50 is not limited to two line sensors L1 and L2, and may process magnetoresistance effects detected by three or more line sensors. The information processor 50 may be or may include a processor, such as processing circuitry, and may be configured to execute non-transitory machine-readable instructions that, when executed by the information processor 50, cause the information processor 50 to perform various actions.

Figure 15:
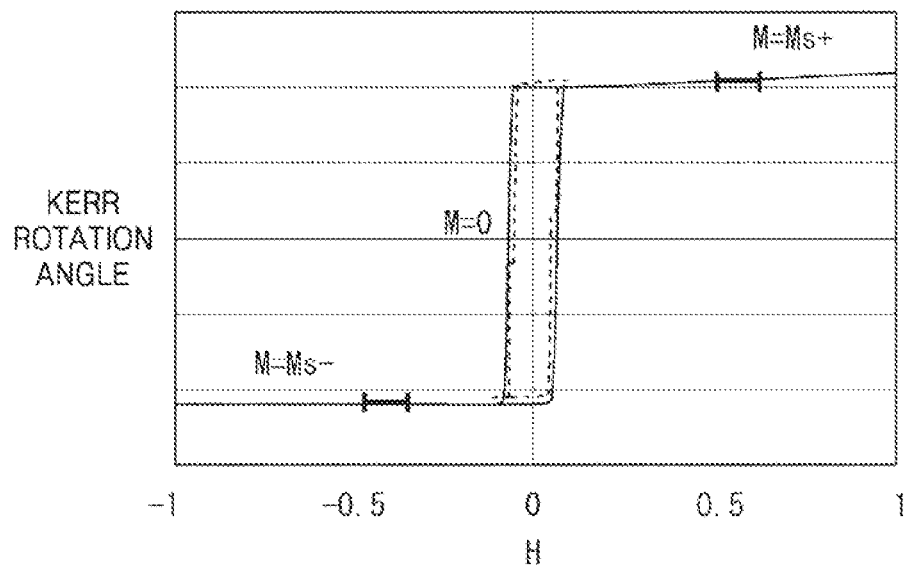
FIG. 15 is a graph showing a Kerr rotation angle in the inspection device according to various example embodiments, wherein a horizontal axis represents a magnetic field component in the Z-axis direction of an external magnetic field, and a vertical axis represents the Kerr rotation angle.

FIG. 15 is a graph showing a Kerr rotation angle in the inspection device 1 according to various example embodiments, wherein the horizontal axis indicates a magnetic field component of an external magnetic field in the Z-axis direction and the vertical axis indicates the Kerr rotation angle. As shown in FIG. 15, in an MRAM, a Kerr rotation angle represents hysteresis due to an external magnetic field. A luminance due to the Kerr rotation angle when the magnetic field component in the Z-axis direction is the +Z-axis direction is referred to as Ms+. A luminance due to the Kerr rotation angle when the magnetic field component in the Z-axis direction is the −Z-axis direction is referred to as Ms−. A luminance due to the Kerr rotation angle when the magnetic field component in the Z-axis direction is 0 without hysteresis is referred to as M=0.

Figure 16:
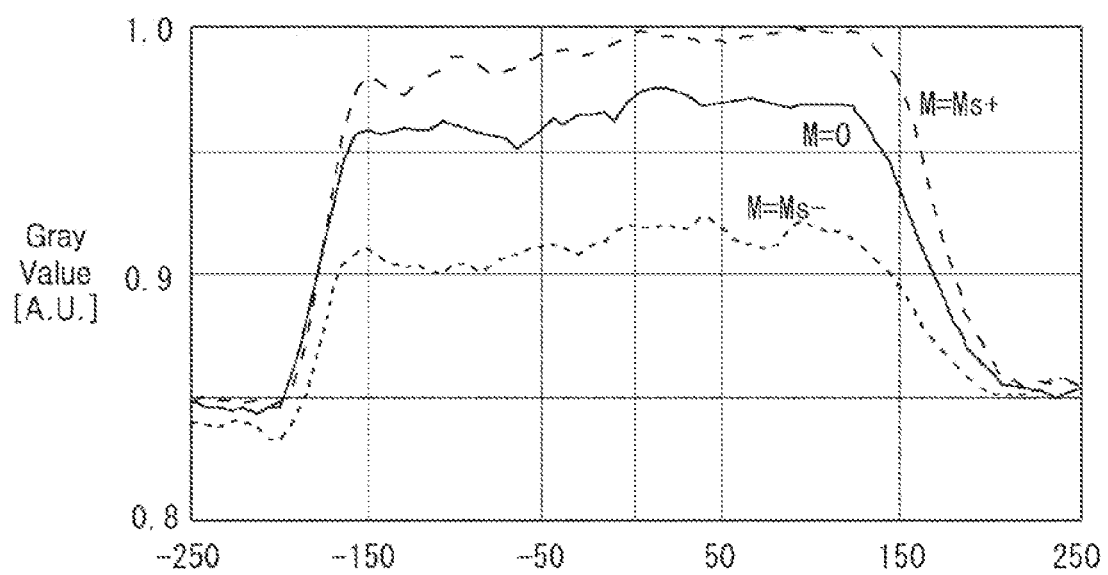
FIG. 16 is a graph showing a gray value of an MRAM in the inspection device according to various example embodiments, wherein the horizontal axis indicates the MRAM and the vertical axis indicates the gray value.

FIG. 16 is a graph showing a gray value of an MRAM in the inspection device 1 according to various example embodiments, wherein the horizontal axis indicates the MRAM and the vertical axis indicates the gray value. As shown in FIG. 16, the gray value of a luminance varies according to the Kerr rotation angle of the MRAM. There is a large difference between a gray value by the luminance Ms+ and a gray value by the luminance Ms−. Therefore, as in various example embodiments, the detector 40 including the plurality of line sensors L1 and L2 may detect a difference Diff that is greater than a difference Diff between luminances detected by one line sensor.

Some effects of example embodiments will now be described. The inspection device 1 according some example embodiments has a gradient magnetic field. In the gradient magnetic field, a magnetic field component changes from the +Z axis direction to the −Z-axis direction according to the position of the inspection surface W0. The gradient magnetic field is temporally constant and spatially variable, e.g. varies from place to place. A magnetic field given to the MRAM is changed by moving in this gradient magnetic field. Accordingly, the distribution of the magnetic field generated by the magnet 20 such as an electromagnet may be constant as the gradient magnetic field. Therefore, it is not or may not be necessary to change a current flowing in the coil of the electromagnet during inspection. Accordingly, a measurement speed due to the responsiveness of the electromagnet is not reduced, and thus, the measurement time may be shortened and throughput may be improved.

The magnetization distribution of the MRAM is monitored as an image and multiplied using the line sensor 41 such as a TDI camera. Therefore, high-sensitivity measurement is possible, and long-term imaging performed so far is unnecessary. As such, the use of two or more line sensors 41 and the magnet 20 for generating a gradient magnetic field with respect to the MRAM shortens the inspection times leading to an improvement in a detect detection capability.

The inspection device 1 may measure a hysteresis distribution by changing the shape of a magnetic field distribution to a vertical magnetic field distribution by independently switching the directions of currents in a plurality of electromagnets.

Figure 17:
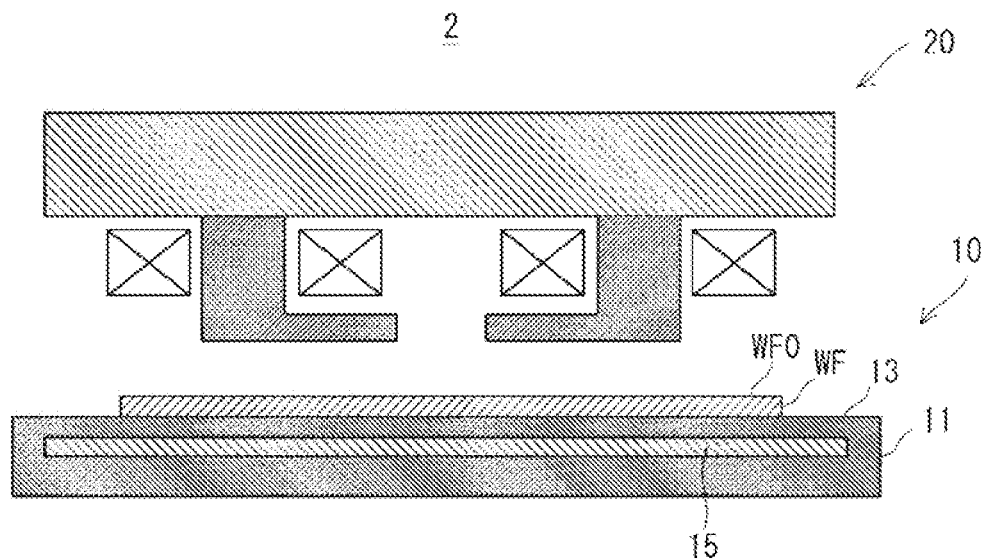
FIG. 17 is a cross-sectional view illustrating a stage and a magnet in an inspection device according to various example embodiments.

An inspection device according to various example embodiments will now be described. In the inspection device 1 according to various example embodiments, a plate member including a magnetic body is buried in the stage 10. FIG. 17 is a cross-sectional view illustrating a stage 10 and a magnet 20 in an inspection device 2 according to various example embodiments. As shown in FIG. 17, the stage 10 in the inspection device 2 includes a plate member 15. The plate member 15 is plate-shaped and includes a magnetic body. The plate member 15 may be or may include, for example, an iron plate. The plate member 15 is not limited to an iron plate as long as it includes a magnetic body. The plate member 15 is buried inside the stage 10 and is not exposed to the stage surface 13.

A region surrounded by the outer periphery of the plate member 15 when viewed in a direction perpendicular to the stage surface 13 includes an MRAM fixed to the stage surface 13. For example, the area of the region surrounded by the outer periphery of the plate member 15 when viewed in the direction perpendicular to the stage surface 13 is greater than the area of the MRAM fixed to the stage surface 13.

The wafer WF includes a plurality of MRAMs, and, when the wafer WF is fixed to the stage surface 13, the region surrounded by the outer periphery of the plate member 15 when viewed in the direction perpendicular to the stage surface 13 includes the wafer WF fixed to the stage surface 13. For example, the area of the region surrounded by the outer periphery of the plate member 15 when viewed in the direction perpendicular to the stage surface 13 is greater than the area of the wafer WF fixed to the stage surface 13. Such a structure may stabilize a gradient magnetic field. Other configurations and effects in various example embodiments are included in the description of various example embodiments.

Figure 18:
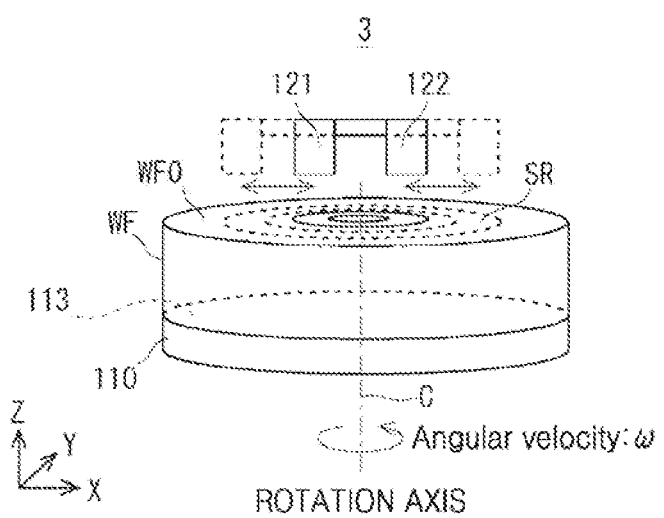
FIG. 18 is a perspective view illustrating a stage and two magnets in an inspection device according to various example embodiments.

An inspection device according to various example embodiments will now be described. According to various example embodiments, the stage 10 rotates about a rotation axis perpendicular to the stage surface 13. Accordingly, the stage 10 rotates and moves the MRAM about a rotation axis perpendicular to the inspection surface W0. FIG. 18 is a perspective view illustrating a stage 110 and two magnets 121 and 122 in an inspection device 3 according to various example embodiments. As shown in FIG. 18, the stage 110 in the inspection device 3 may be in the shape of, for example, a disk plate. The stage 110 has a stage surface 113, and rotates about a rotation axis C perpendicular to the stage surface 113. A direction opposite to a rotation direction of the hand of a watch about the rotation axis C a $+\theta$ direction.

The two magnets 121 and 122 are arranged over the stage surface 113. A center position between the magnet 121 and the magnet 122 is fixed. However, a distance between the magnet 121 and the magnet 122 is expandable and contractible. For example, when the center position between the magnet 121 and the magnet 122 is fixed to the rotation axis C, the magnet 121 and the magnet 122 are expandable and contractible in a radial direction of the stage 110. Accordingly, the two magnets 121 and 122 generate a gradient magnetic field by adjusting an interval between the two magnets 121 and 122, based on the location of an MRAM to be inspected. The center position between the magnet 121 and the magnet 122 is not limited to being on the rotation axis C.

When the center of the wafer WF is arranged on the rotation axis C, the plurality of line sensors 41 measure magnetic field properties due to the magnet 121 and the magnet 122, respectively. Each of the line sensors 41 may measure a magnetic field property due to a magnetic field (+H) in the +Z-axis direction and a magnetic field property due to a magnetic field (−H) in the −Z-axis direction, by rotating the wafer WF once. A measurement region SR in the inspection surface W0 has a ring shape having, as its center, a rotation axis C.

A distance from the center of the wafer WF to the magnet 121 (or the magnet 122) is referred to as r. A tangential speed v (linear speed) of the measurement region SR depends on the distance r from the center of the wafer WF In other words, at v=rω, an angular velocity ω is adjusted to match a scan speed of the line sensor 41 such as a TDI sensor. Thus, the line sensor 41 obtains an image of a magneto-optical effect. According to various example embodiments, due to application of the stage 110 that rotates, a return time may be saved compared to an XY stage, and a multiplication direction of the line sensor 41 such as a TDI sensor may not need to be controlled with respect to a scan direction. Several modifications of various example embodiments will be shown below.

Figure 19:
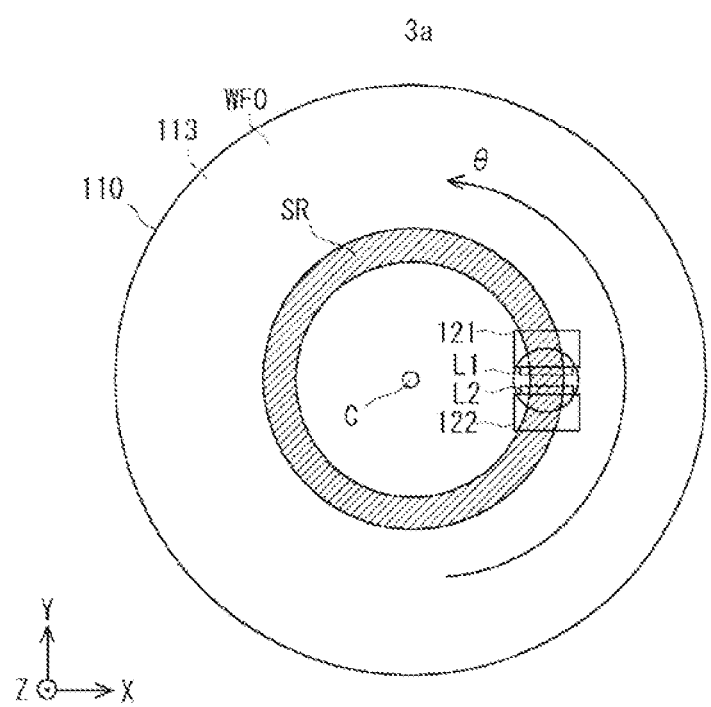
FIG. 19 is a plan view illustrating a layout of a stage, magnets, and line sensors in an inspection device according to modification 1 of various example embodiments.

FIG. 19 is a plan view illustrating a layout of the step 110, the magnets 121 and 122, and the line sensors L1 and L2 in an inspection device 3a according to modification 1 of various example embodiments. As shown in FIG. 19, in the inspection device 3a according to modification 1, the center position between the magnet 121 and the magnet 122 on the stage surface 113 is between the rotation axis C and the periphery of the stage surface 113 on a +X-axis direction'side. The magnet 121 is arranged on a +Y-axis direction's side of the center position, and the magnet 122 is arranged on a −Y-axis direction's side of the center position. The gradient magnetic field is formed in the Y-axis direction.

The plurality of line sensors L1 and L2 are arranged between the magnet 121 and the magnet 122. Each of the plurality of line sensors L1 and L2 extends in the X-axis direction. As the stage 110 rotates, the plurality of line sensors L1 and L2 measure a ring-shaped measurement area SR whose width is a measurement width of the line sensor 41.

Figure 20:
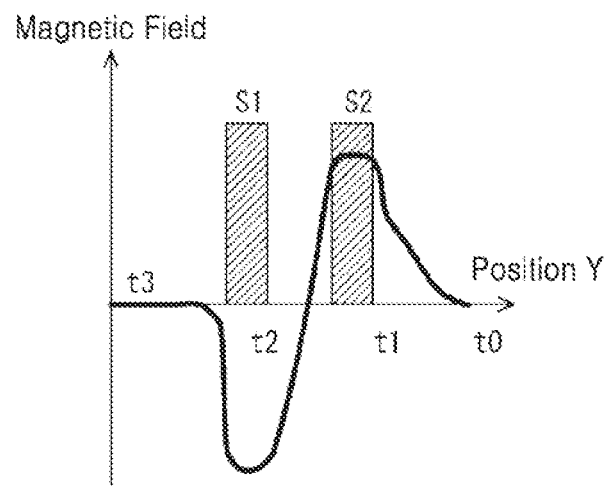
FIG. 20 is a graph showing a magnetic field component in the Z-axis direction on the inspection surface, in the inspection device according to modification 1 of various example embodiments, wherein the horizontal axis indicates a location in the X-axis direction on the inspection surface and the vertical axis indicates the magnetic field component in the Z-axis direction on the inspection surface.
Figure 21:
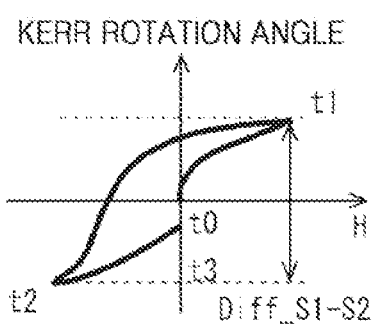
FIG. 21 is a graph showing a Kerr rotation angle on the inspection surface, in the inspection device according to modification 1 of various example embodiments, wherein a horizontal axis represents a magnetic field component in the Z-axis direction of an external magnetic, field, and a vertical axis represents the Kerr rotation angle.

FIG. 20 is a graph showing a magnetic field component in the Z-axis direction on the inspection surface W0, in the inspection device 3a according to modification 1 of various example embodiments. In the graph of FIG. 20, the horizontal axis indicates a location in the X-axis direction on the inspection surface W0, and the vertical axis indicates the magnetic field component in the Z-axis direction on the inspection surface W0. FIG. 21 is a graph showing a Kerr rotation angle on the inspection surface W0 in the inspection device 3a according to modification 1 of various example embodiments, wherein the horizontal axis indicates a magnetic field component of an external magnetic field in the Z-axis direction and the vertical axis indicates the Kerr rotation angle.

As shown in FIGS. 20 and 21, at time t=t0, an MRAM is positioned at a region where the magnetic field component in the Z-axis direction is zero. When the MRAM is moved in the $+\theta$ direction, an external magnetic field received by the MRAM increases. Accordingly, the Kerr rotation angle is also increased. However, when the Kerr rotation angle reaches a certain value, the Kerr rotation angle is saturated, and does not change even when the external magnetic field is increased (time t=t1). The line sensor L2 obtains the luminances of the plurality of MRAMs arranged in the radial direction at time t=t1 due to the Kerr rotation angle.

When the MRAM is moved in the $+\theta$ direction, an external magnetic field received by the MRAM decreases. Accordingly, the Kerr rotation angle is decreased. The external magnetic field becomes 0. When the MRAM is moved in the $+\theta$ direction, an external magnetic field received by the MRAM reverses. Accordingly, the Kerr rotation angle is decreased. When the MRAM is moved in the $+\theta$ direction, an external magnetic field in a reverse direction received by the MRAM increases. Accordingly, the Kerr rotation angle is further decreased. At time t=t2, when the external magnetic field in the reverse direction increases, the Kerr rotation angle decreases.

The line sensor L1 obtains the luminances of a plurality of MRAMs arranged in the radial direction at time t=t1 due to the Kerr rotation angle. When the MRAM is moved in the $+\theta$ direction, an external magnetic field received by the MRAM decreases. The external magnetic field becomes 0.

As shown in FIG. 20, according to various example embodiments, the line sensor L2 obtains the luminances of the plurality of MRAMs at time t=t1. The line sensor L1 obtains the luminances of the plurality of MRAM; at time t=t2. The information processor 50 detects a difference (Dill) between a luminance of a defective MRAM at time t=t1 and a luminance of the defective MRAM at time t=t2.

Figure 22:
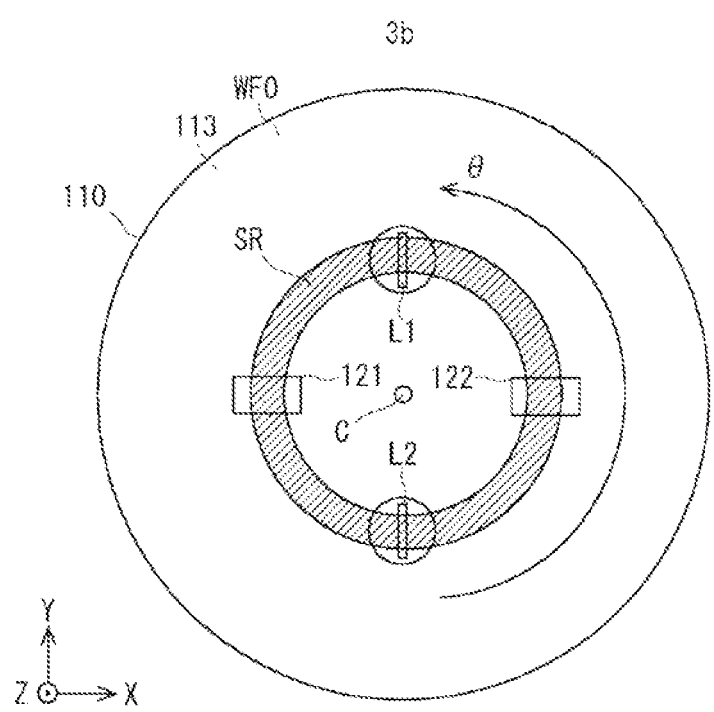
FIG. 22 is a plan view illustrating a layout of a stage, magnets, and line sensors in an inspection device according to modification 2 of various example embodiments.

An inspection device according to modification 2 of various example embodiments will now be described, FIG. 22 is a plan view illustrating a layout of the stage 110, the magnets 121 and 122, and the line sensors L1 and L2 in an inspection device 3b according to modification 2 of various example embodiments. As shown in FIG. 22, in the inspection device 3b, the center position between the magnet 121 and the magnet 122 on the stage surface 113 is on the rotation axis C. The magnet 121 is arranged on a −X-axis direction's side of the rotation axis C, and the magnet 122 is arranged on a +X-axis direction's side of the rotation axis C. The gradient magnetic field is formed in the X-axis direction.

The plurality of line sensors L1 and L2 are arranged on a +Y-axis direction's side of the rotation axis C and on a −Y-axis direction's side of the rotation axis C. Each of the plurality of line sensors L1 and L2 extends in the Y-axis direction. The magnet 121, the magnet 122, the line sensor L1, and the line sensor L2 are positioned at the same distance from the rotation axis C. Thus, the magnet 121, the line sensor L1, the magnet 122, and the line sensor L2 are arranged at equal intervals on a circumference around the rotation axis C. As the stage 110 rotates, the plurality of line sensors L1 and L2 measure a dog-shaped measurement area SR whose width is a measurement width of the line sensor 41.

Figure 23:
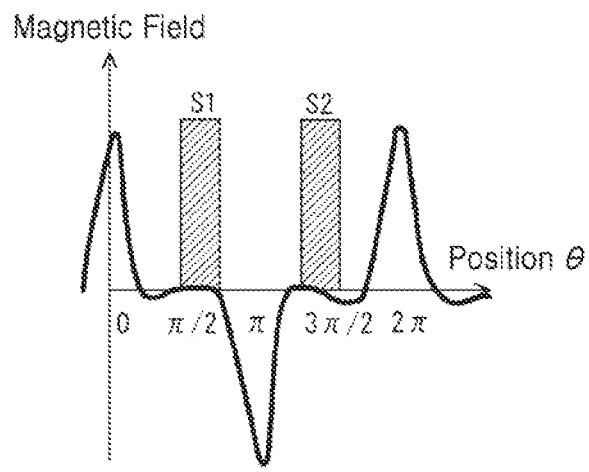
FIG. 23 is a graph showing a magnetic field component in the Z-axis direction on the inspection surface W0, in the inspection device according to modification 2 of various example embodiments, wherein the horizontal axis indicates a location represented as an angle around a rotation axis and the vertical axis indicates the magnetic field component in the Z-axis direction on the inspection surface.
Figure 24:
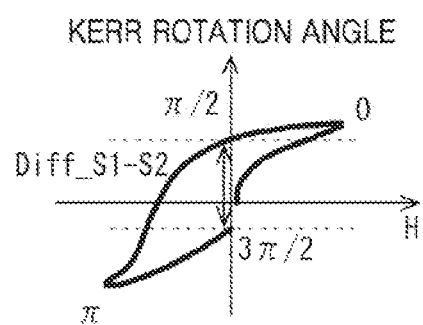
FIG. 24 is a graph showing a Kerr rotation angle on the inspection surface, in the inspection device according to modification 2 of various example embodiments, wherein a horizontal axis represents as magnetic field component in the Z-axis direction of an external magnetic field, and a vertical axis represents the Kerr rotation angle.

FIG. 23 is a graph showing a magnetic field component in the Z-axis direction on the inspection surface W0, in the inspection device 3b according to modification 2 of various example embodiments. In the graph of FIG. 23, the horizontal axis indicates a location on the measurement area SR that is represented as an angle around the rotation axis C, and the vertical axis indicates the magnetic field component in the Z-axis direction on the inspection surface W0. FIG. 24 is a graph showing a Ken rotation angle on the inspection surface W0, in the inspection device 3b according to modification 2 of various example embodiments, wherein the horizontal axis indicates a magnetic field component of an external magnetic field in the Z-axis direction and the vertical axis indicates the Kerr rotation angle.

As shown in FIGS. 23 and 24, at a position of on the inspection surface W0, an MRAM is right below the magnet 122. Thus, the MRAM is positioned in a region having a large magnetic field in the +Z-axis direction. When the MRAM is moved in the +θ direction, an external magnetic field received by the MRAM decreases. Accordingly, the Kerr rotation angle is also decreased. At θ=π/2, the external magnetic field becomes 0. The line sensor L1 obtains the luminances of a plurality of MRAMs arranged in the radial direction at due to the Kerr rotation angle.

When the MRAM is moved in the θ direction, an external magnetic field received by the MRAM increase. Accordingly, the Kerr rotation angle is decreased. At θ=π, the MRAM is right below the magnet 121. Thus, the MRAM is positioned in a region having a large magnetic field in the reverse direction. When the MRAM is moved in the +θ direction, an external magnetic field in the reverse direction received by the MRAM decreases. At θ=3π/2, the external magnetic field becomes 0. The line sensor L2 obtains the luminances of a plurality of MRAMs arranged in the radial direction at θ=3π/2 due to the Kerr rotation angle. The information processor 50 detects a difference (Diff) between a luminance of a defective MRAM θ=π/2 and a luminance of the defective MRAM at θ=3π/2.

Figure 25:
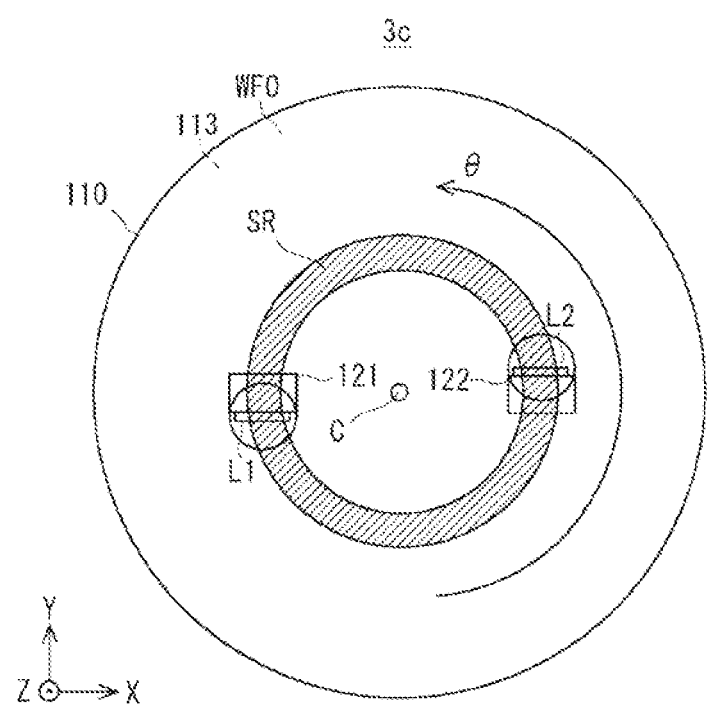
FIG. 25 is a plan view illustrating a layout of a stage, magnets, and line sensors in an inspection device according to modification 3 of various example embodiments.

An inspection device according to modification 3 of various example embodiments will now be described. FIG. 25 is a plan view illustrating a layout of the stage 110, the magnets 121 and 122, and the line sensors L1 and L2 in an inspection device 3c according to modification 3 of various example embodiments. As shown in FIG. 25, in the inspection device 3c, the center position between the magnet 121 and the magnet 122 on the stage surface 113 is on the rotation axis C. The magnet 121 is arranged on a −X-axis direction's side of the rotation axis C, and the magnet 122 is arranged on a +X-axis direction's side of the rotation axis C. The gradient magnetic field is formed in the X-axis direction.

The line sensor L1 is arranged on a slight +θ direction's side of the magnet 121, and the line sensor L2 is arranged on a slight +θ direction's side of the magnet 122. Each of the plurality of line sensors L1 and L2 extends in the X-axis direction. As the stage 110 rotates, the plurality of line sensors L1 and L2 measure a ring-shaped measurement area SR whose width is a measurement width of the line sensor 41.

Figure 26:
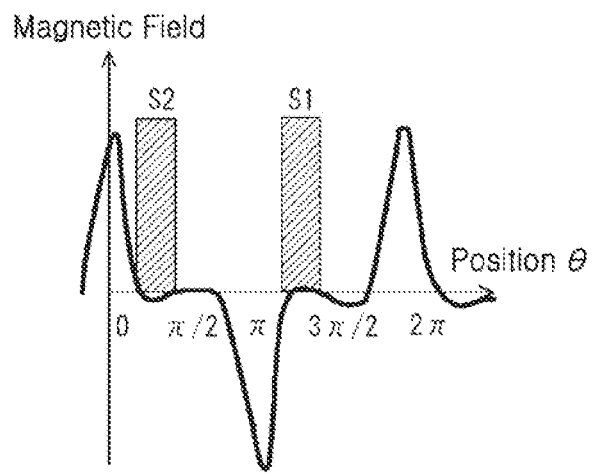
FIG. 26 is a graph showing a magnetic field component in the Z-axis direction on the inspection surface W0, in the inspection device according to modification 3 of various example embodiments, wherein the horizontal axis indicates a location represented as an angle around a rotation axis and the vertical axis indicates the magnetic field component in the Z-axis direction on the inspection surface.
Figure 27:
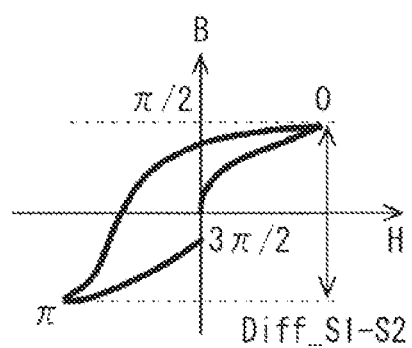
FIG. 27 is a graph showing a Kerr rotation angle on the inspection surface, in the inspection device according to modification 3 of various example embodiments, wherein a horizontal axis represents a magnetic field component in the Z-axis direction of an external magnetic field, and a vertical axis represents the Kerr rotation angle.

FIG. 26 is a graph showing a magnetic field component in the Z-axis direction on the inspection surface W0, in the inspection device 3c according to modification 3 of various example embodiments. In the graph of FIG. 26, the horizontal axis indicates a location on the measurement area. SR that is represented as an angle around the rotation axis C, and the vertical axis indicates the magnetic field component in the Z-axis direction on the inspection surface W0. FIG. 27 is a graph showing a Kerr rotation angle on the inspection surface W0, in the inspection device 3c according to modification 3 of various example embodiments, wherein the horizontal axis indicates a magnetic field component of an external magnetic field in the Z-axis direction and the vertical axis indicates the Kerr rotation angle.

As shown in FIGS. 26 and 27, at a positron of θ=0 on the inspection surface W0, an MRAM is right below the magnet 122. Thus, the MRAM is positioned in a region having a large magnetic field in the +Z-axis direction. The line sensor L2 obtains the luminances of a plurality of MRAMs arranged in a radial direction slightly moved in the +θ direction from the magnet 122 due to the Kerr rotation angle.

When the MRAM is moved in the +θ direction, an external magnetic field received by the MRAM increases. Accordingly, the Kerr rotation angle is decreased. At θ=π/2, the external magnetic field becomes 0. When the MRAM is moved in the +θ direction, an external magnetic field in a reverse direction received by the MRAM increases. Accordingly, the Kerr rotation angle is increased.

At θ=π, the MRAM is right below the magnet 121. Thus, the MRAM is positioned a region having a large magnetic field in the reverse direction. The line sensor L1 obtains the luminances of a plurality of MRAMs arranged in a radial direction slightly moved in the +θ direction from the magnet 121 due to the Kerr rotation angle.

When the MRAM is moved in the +θ direction, an external magnetic field in the reverse direction received by the MRAM decreases. At θ=3π/2, the external magnetic field becomes 0. The information processor 50 detects a difference (Diff) between a luminance of a defective MRAM at a position of the slight +θ direction at θ=0 and a luminance of the defective MRAM at a position of the slight +θ direction at θ=π. Other configurations and effects in modifications 1 through 3 of various example embodiments are included in the description of embodiments 1 and 2.

Any of the elements and/or functional blocks disclosed above may include or be implemented in processing circuitry such as hardware including logic circuits; a hardwaref/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a Systemon-Chip (SoC), a programmable logic unit, a microprocessor, application-specific integrated circuit (ASIC), etc. The processing circuitry may include electrical components such as at least one of transistors, resistors, capacitors, etc. The processing circuitry may include electrical components such as logic gates including at least one of AND gates, OR gates, NAND gates, NOT gates, etc.

While various inventive concepts have been particularly shown and described with reference to various example embodiments thereof, it will be understood that various changes in form and details may be made therein without departing from the spirit and scope of the following claims. For example, combining respective configurations of various example embodiments is also within the scope of inventive concepts. Example embodiments are not necessarily mutually exclusive with one another. For example, some example embodiments may include one or more features described with reference to one or more figures, and may also include one or more features described with reference to one or more other figures.

What is claimed is:

1. An inspection device comprising:
a stage configured to fix a magnetoresistive random access memory (MRAM) to a stage surface and to move the MRAM within an inspection surface parallel to the stage surface;
a plurality of magnets configured to generate a gradient magnetic field in which a direction of a magnetic field component perpendicular to the inspection surface is changed from a first direction to a second direction antiparallel with the first direction by a position of the inspection surface;
a plurality of line sensors comprising a first line sensor configured to detect a magneto-optical effect at a first location of the MRAM and a second line sensor configured to detect the magneto-optical effect at a second location that is different from the first location, the first line sensor and the second line sensor configured to detect the magneto-optical effect by moving a location of the MRAM within the gradient magnetic field; and
an information processor configured to execute machine-readable instructions that, when executed by the information processor, cause the information processor to process the magneto-optical effect detected by the plurality of line sensors.

2. The inspection device of claim 1, wherein the plurality of line sensors are configure to detect at least one of the magneto-optical effect by the magnetic field component in the first direction, the magneto-optical effect by the magnetic field component in the second direction, and the magneto-optical effect by a magnetic field component in a direction perpendicular to the inspection surface.

3. The inspection device of claim 1, wherein the information processor is further caused to inspect the MRAM through a difference between the magneto-optical effect detected by the first line sensor and the magneto-optical effect detected by the second line sensor.

4. The inspection device of claim 1, further comprising:
a plate member including a magnetic body, wherein
the plate member including the magnetic body is buried in the stage, and
when viewed in a direction perpendicular to the stage surface a region surrounded by an outer edge of the plate member includes the MRAM fixed to the stage surface.

5. The inspection device of claim 1, wherein the plurality of magnets comprise turn electromagnets configured to be independently controlled by applied currents.

6. The inspection device of claim 1, wherein the stage is configured to linearly move at least one of the MRAM or a beta film of a perpendicular magnetization layer before formation of the MRAM, the linear movement in one direction within the inspection surface.

7. The inspection device of claim 1, wherein the stage is configured to move at least one of the MRAM or a beta film of a perpendicular magnetization layer before formation of the MRAM by rotating the MRAM or the perpendicular magnetization beta layer about a rotation axis that is perpendicular to the inspection surface.

8. The inspection device of claim 1, wherein the first line sensor comprises a first Time Delay integration (TDI) sensor and the second line sensor comprises a second TDI sensor.

9. An inspection device comprising:
a stage having a stage surface to which a wafer is configured to be fixed, and configured to move the wafer within an inspection surface parallel to the stage surface, wherein the wafer includes at least one of a plurality of magnetoresistive random access memories (MRAMs) or a beta film of a perpendicular magnetization layer before formation of the MRAM;
a plurality of magnets configured to generate a gradient magnetic field in which a direction of a magnetic field component perpendicular to the inspection surface is changed from a first direction to a second direction antiparallel with the first direction by a position of the inspection surface;
a plurality of line sensors comprising a first line sensor for detecting a magneto-optical effect at a first location of the MRAM and a second line sensor for detecting the magneto-optical effect at a second location that is different from the first location by moving a location of the MRAM within the gradient magnetic field; and
an information processor configured to execute machine-readable instructions that, when executed by the information processor, cause the information processor to process the magneto-optical effect detected by the plurality of line sensors.

10. The inspection device of claim 9, wherein
a plate member including a magnetic body is buried in the stage, and
a region surrounded by an outer edge of the magnetic body when viewed in a three on perpendicular to the stage surface includes the wafer fixed to the stage surface.

11. The inspection device of claim 9, wherein the plurality of magnets are configured to generate the gradient magnetic field by adjusting a gap between the plurality of magnets, the gap based on at least one of a location of the MRAM or a location of the beta film of a perpendicular magnetization layer.

12. An inspection device comprising
a stage having a stage surface to which a wafer is configured to be fixed, the stage configured to move the water within an inspection surface parallel to the stage surface, and including a plate member including a magnetic body, wherein the wafer includes at least one of a plurality of magnetoresistive random access memories (MRAMs) or a beta film of a perpendicular magnetization layer before formation of the MRAM, and the plate member is buried in the stage;
a plurality of magnets configured to generate a gradient magnetic field in which a direction of a magnetic field component perpendicular to the inspection surface is changed from a first direction to a second direction antiparallel with the first direction by a position of the inspection surface;

a plurality of line sensor comprising a first line sensor configured to detect a magneto-optical effect at a first location of the MRAM and a second line sensor configured to detect the magneto-optical effect at a second location that is different from the first location, the plurality of line sensors configured to detect the magneto-optical effect by moving a location of the MRAM within the gradient magnetic field; and an information processor configured to execute machine-readable instructions that, when executed by the information processor, cause the information processor to process the magneto-optical effect detected by the plurality of line sensors, wherein the plurality of line sensors are configured to detect at least one of the magneto-optical effect by the magnetic field component in the first direction, the magneto-optical effect b the magnetic field component in the second direction, and the magneto-optical effect by a magnetic field component in a direction perpendicular to the inspection surface, the information processor is configured to be caused to inspect the MRAM through a difference between the magneto-optical effect detected by the first line sensor and the magneto-optical effect detected by the second line sensor, and a region surrounded by an outer edge of the plate member when viewed in a direction perpendicular to the stage surface includes the MRAM fixed to the stage surface.

* * * * *